US012722494B2

(12) United States Patent
Takesue et al.

(10) Patent No.: US 12,722,494 B2
(45) Date of Patent: Sep. 1, 2026

(54) VEHICLE, CONTROLLER OF VEHICLE, AND CONTROL METHOD FOR VEHICLE

(71) Applicant: TOYOTA JIDOSHA KABUSHIKI KAISHA, Toyota (JP)

(72) Inventors: Ippei Takesue, Toyota (JP); Masashi Kobayashi, Toyota (JP); Sohichi Imai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 2 days.

(21) Appl. No.: 19/055,693

(22) Filed: Feb. 18, 2025

(65) Prior Publication Data

US 2025/0303870 A1 Oct. 2, 2025

(30) Foreign Application Priority Data

Apr. 1, 2024 (JP) ................................ 2024-058822

(51) Int. Cl.

*B60L 1/00* (2006.01)
*B60L 1/02* (2006.01)
*B60L 58/27* (2019.01)
*H03K 7/08* (2006.01)

(52) U.S. Cl.

CPC ................ *B60L 1/003* (2013.01); *B60L 1/02* (2013.01); *B60L 58/27* (2019.02); *H03K 7/08* (2013.01); *B60L 2240/12* (2013.01); *B60L 2240/545* (2013.01); *B60L 2270/46* (2013.01)

(58) Field of Classification Search

None

See application file for complete search history.

(56) References Cited

U.S. PATENT DOCUMENTS 6,315,369 B1 * 11/2001 Hirose .................. B60T 8/4081 303/10
8,932,743 B2 * 1/2015 Simonini .............. H01M 10/66 429/61
10,436,081 B2 * 10/2019 Kim ...................... B60W 20/17
11,705,852 B2 * 7/2023 Kobayashi ............. F04D 15/00 318/472
11,898,657 B2 * 2/2024 Schoeneman ........... F01P 7/165
2012/0148889 A1 * 6/2012 Fuhr ................... H01M 50/264 429/87
2013/0138311 A1 * 5/2013 Kang ..................... B60W 10/11 903/902

(Continued)

FOREIGN PATENT DOCUMENTS

JP 2023-118569 A 8/2023
JP 2023-140375 A 10/2023

*Primary Examiner* — Jonathan M Dager
(74) *Attorney, Agent, or Firm* — Oliff PLC

(57) ABSTRACT

A vehicle includes: a battery; a thermal management system; and an ECU. The thermal management system includes an electric pump that circulates a heat medium that exchanges heat with the battery. The thermal management system performs thermal management in the vehicle. When a temperature of the battery is raised using the thermal management system, ECU controls the electric pump such that a noise caused by driving of the electric pump is suppressed when there is no background noise as compared with when there is a background noise, the background noise being a noise caused by a device other than the electric pump.

11 Claims, 8 Drawing Sheets

(56) References Cited

U.S. PATENT DOCUMENTS

| | | | | |
|---|---|---|---|---|
| 2013/0149170 | A1* | 6/2013 | Song | F16H 61/0025 417/32 |
| 2015/0025739 | A1* | 1/2015 | Wakairo | F16H 61/0025 701/36 |
| 2019/0070924 | A1* | 3/2019 | Mancini | B60H 1/32281 |
| 2019/0126755 | A1* | 5/2019 | Yoshida | B60W 10/30 |
| 2020/0062106 | A1* | 2/2020 | Wong | B60L 58/27 |
| 2021/0146776 | A1* | 5/2021 | Bollinger | H01M 10/44 |
| 2022/0097487 | A1* | 3/2022 | Jin | H01M 10/6568 |
| 2022/0158274 | A1* | 5/2022 | Peron | H01M 10/635 |
| 2023/0256793 | A1 | 8/2023 | Hoshino | |
| 2024/0262157 | A1* | 8/2024 | Shrivastava | B60H 1/00278 |
| 2025/0079551 | A1* | 3/2025 | Jeon | H01M 10/48 |
| 2025/0251180 | A1* | 8/2025 | Kami | F25B 1/00 |

* cited by examiner

USER EQUIPMENT
8
1
DCM
41
ECU
50
HMI
42
THERMAL MANAGEMENT SYSTEM
30
ELECTRIC PUMP
371
PWC
22
BAT
10
PCU
23
MG
24
21
92
91
CHARGING
EXTERNAL POWER FEEDING
EXTERNAL DEVICE
9

30
FIVE-WAY VALVE
39
FIVE-WAY VALVE
38
HIGH-TEMPERATURE CIRCUIT
31
W/P
311
ELECTRIC HEATER
312
THREE-WAY VALVE
313
HEATER CORE
314
R/T
315
RADIATOR
32
LOW-TEMPERATURE CIRCUIT
33
W/P
331
PCU
23
O/C
332
PWC
22
R/T
333
CONDENSER
34
REFRIGERATION CYCLE
35
COMPRESSOR
351
EXPANSION VALVE
352
EVAPORATOR
353
EPR
354
EXPANSION VALVE
355
CHILLER
36
BATTERY CIRCUIT
37
ELECTRIC PUMP
371
ELECTRIC HEATER
372
BAT
10
BYPASS
373

30
31
32
321
322
312
ELECTRIC HEATER
313
314
HEATER CORE
315
R/T
311
34
35
351
354
EPR
353
EVAPORATOR
352
355
36
37
371
38
P11
P12
P13
P14
P15
372
ELECTRIC HEATER
10
BAT
39
P21
P22
P23
P24
P25
373
33
22
PWC
332
O/C
23
PCU
333
R/T
331

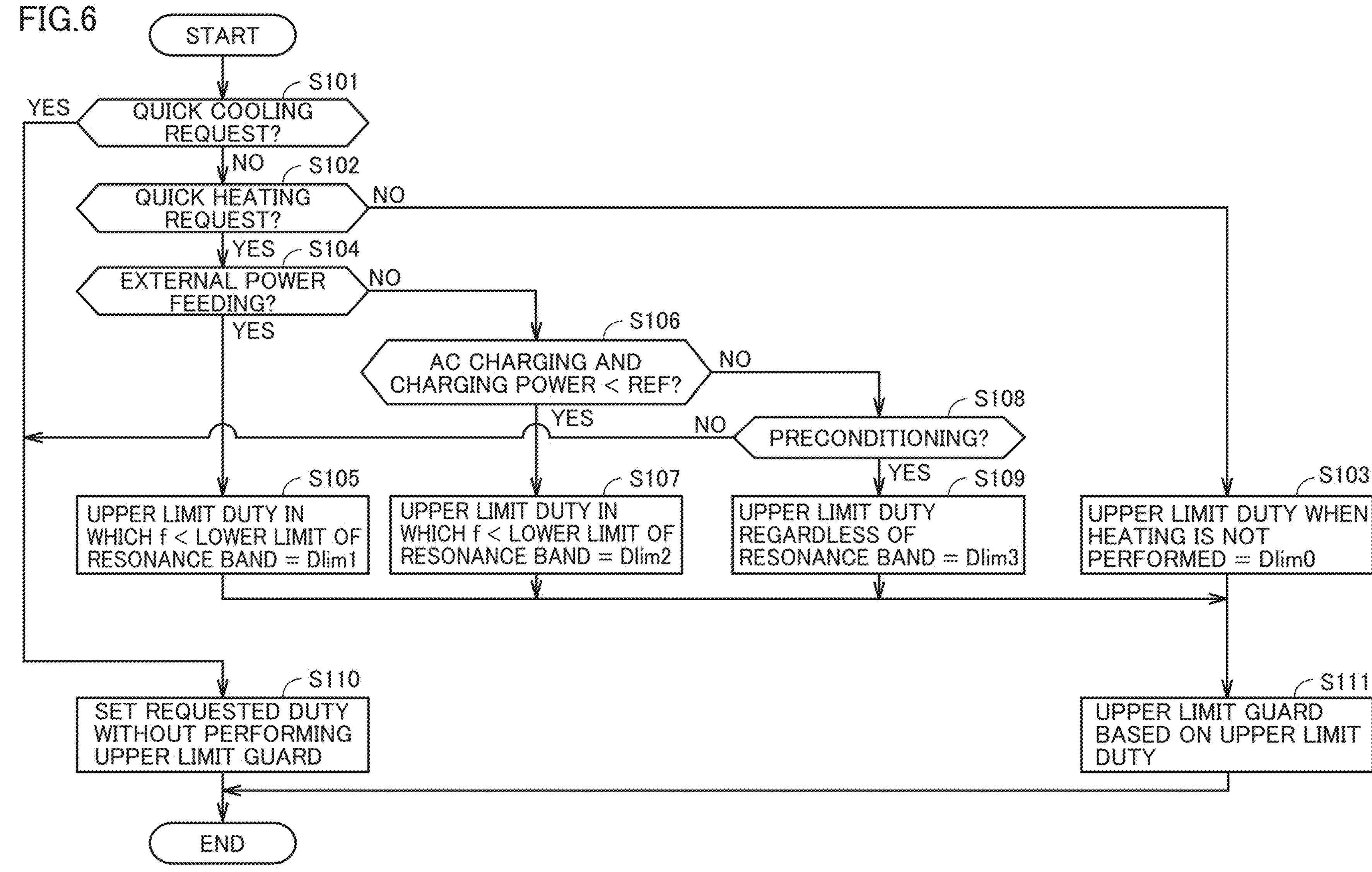
FIG.6
START
S101
QUICK COOLING REQUEST?
YES
NO
S102
QUICK HEATING REQUEST?
NO
YES
S104
EXTERNAL POWER FEEDING?
NO
YES
S106
AC CHARGING AND CHARGING POWER < REF?
NO
YES
S108
PRECONDITIONING?
NO
YES
S105
UPPER LIMIT DUTY IN WHICH f < LOWER LIMIT OF RESONANCE BAND = Dlim1
S107
UPPER LIMIT DUTY IN WHICH f < LOWER LIMIT OF RESONANCE BAND = Dlim2
S109
UPPER LIMIT DUTY REGARDLESS OF RESONANCE BAND = Dlim3
S103
UPPER LIMIT DUTY WHEN HEATING IS NOT PERFORMED = Dlim0
S110
SET REQUESTED DUTY WITHOUT PERFORMING UPPER LIMIT GUARD
S111
UPPER LIMIT GUARD BASED ON UPPER LIMIT DUTY
END

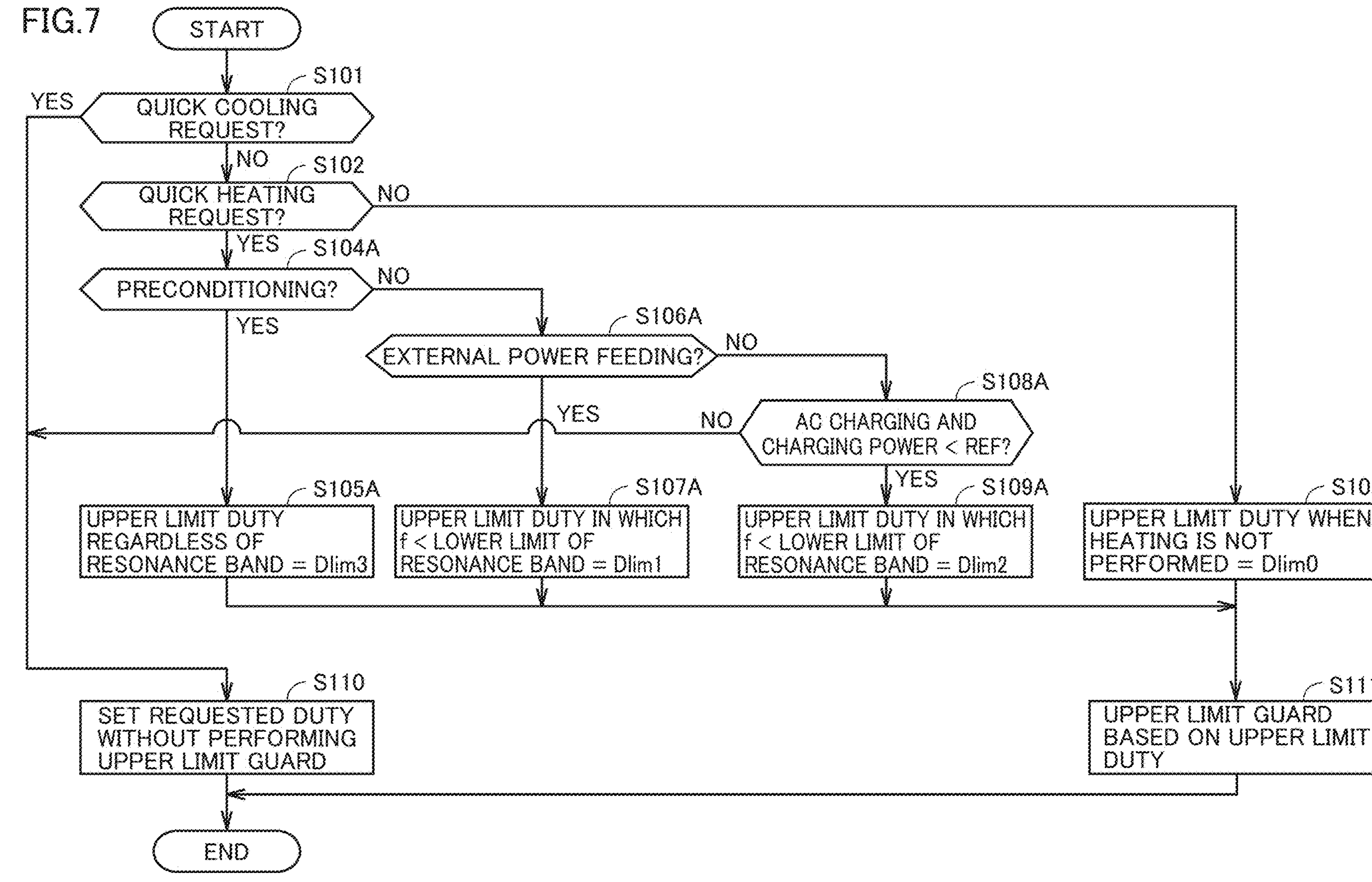
FIG.7
START
S101
QUICK COOLING REQUEST?
YES
NO
S102
QUICK HEATING REQUEST?
NO
YES
S104A
PRECONDITIONING?
NO
YES
S106A
EXTERNAL POWER FEEDING?
NO
YES
S108A
AC CHARGING AND CHARGING POWER < REF?
NO
YES
S105A
UPPER LIMIT DUTY REGARDLESS OF RESONANCE BAND = Dlim3
S107A
UPPER LIMIT DUTY IN WHICH f < LOWER LIMIT OF RESONANCE BAND = Dlim1
S109A
UPPER LIMIT DUTY IN WHICH f < LOWER LIMIT OF RESONANCE BAND = Dlim2
S103
UPPER LIMIT DUTY WHEN HEATING IS NOT PERFORMED = Dlim0
S110
SET REQUESTED DUTY WITHOUT PERFORMING UPPER LIMIT GUARD
S111
UPPER LIMIT GUARD BASED ON UPPER LIMIT DUTY
END

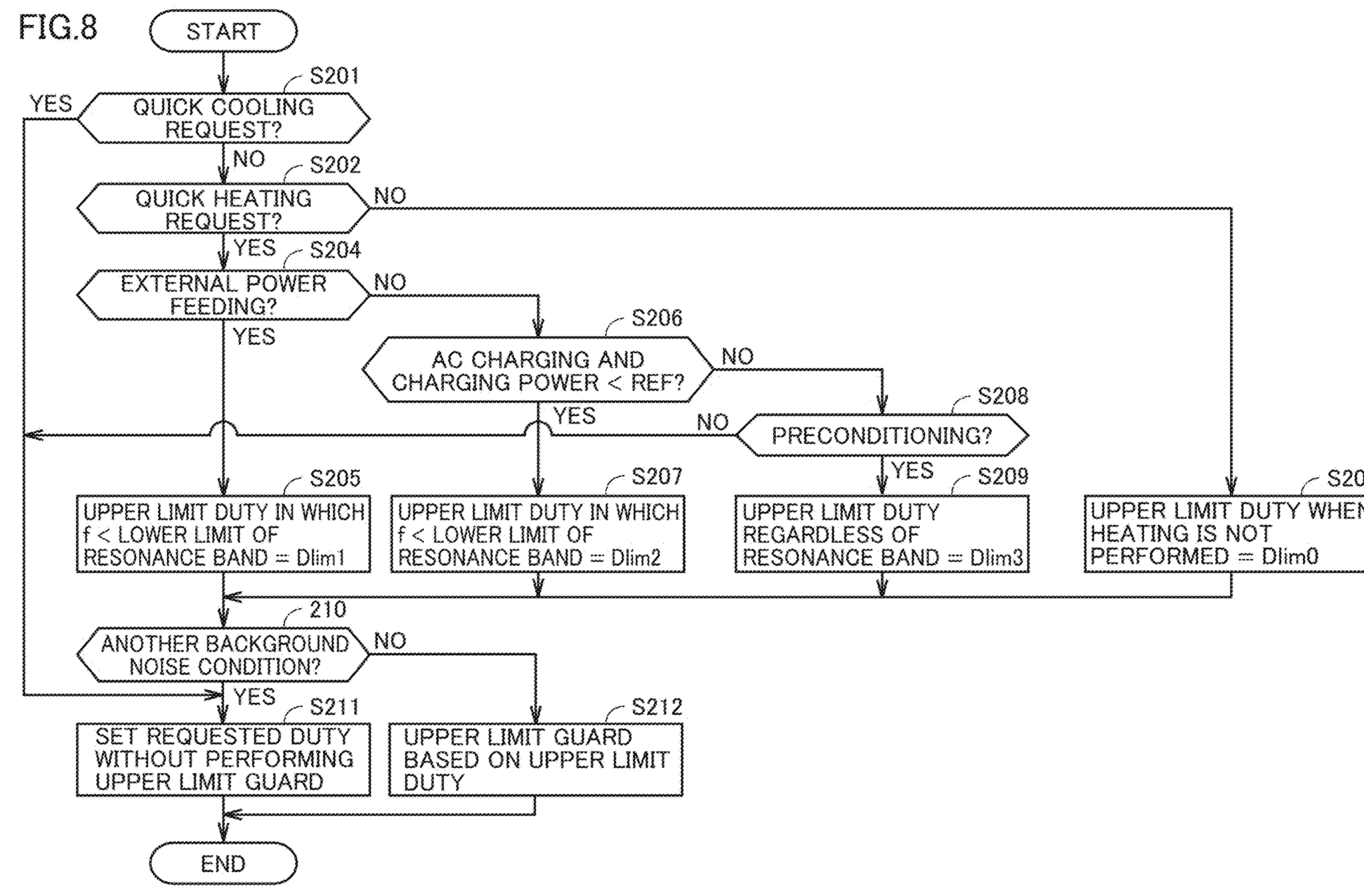
FIG.8
START
S201
QUICK COOLING REQUEST?
YES
NO
S202
QUICK HEATING REQUEST?
NO
YES
S204
EXTERNAL POWER FEEDING?
NO
YES
S206
AC CHARGING AND CHARGING POWER < REF?
NO
YES
S208
PRECONDITIONING?
NO
YES
S205
UPPER LIMIT DUTY IN WHICH f < LOWER LIMIT OF RESONANCE BAND = Dlim1
S207
UPPER LIMIT DUTY IN WHICH f < LOWER LIMIT OF RESONANCE BAND = Dlim2
S209
UPPER LIMIT DUTY REGARDLESS OF RESONANCE BAND = Dlim3
S203
UPPER LIMIT DUTY WHEN HEATING IS NOT PERFORMED = Dlim0
210
ANOTHER BACKGROUND NOISE CONDITION?
NO
YES
S211
SET REQUESTED DUTY WITHOUT PERFORMING UPPER LIMIT GUARD
S212
UPPER LIMIT GUARD BASED ON UPPER LIMIT DUTY
END

VEHICLE, CONTROLLER OF VEHICLE, AND CONTROL METHOD FOR VEHICLE

CROSS REFERENCE TO RELATED APPLICATIONS

This nonprovisional application is based on Japanese Patent Application No. 2024-058822 filed on Apr. 1, 2024 with the Japan Patent Office, the entire contents of which are hereby incorporated by reference.

BACKGROUND

Field

The present disclosure relates to a vehicle, a controller of a vehicle, and a control method for a vehicle.

Description of the Background Art

A temperature control system disclosed in Japanese Patent Laying-Open No. 2023-118569 includes a battery temperature control circuit. The battery temperature control circuit is a circuit that circulates a battery heat medium, and causes the battery heat medium discharged from a water pump to flow through a battery. The temperature of the battery is raised by heat exchange in the battery temperature control circuit (refer to [0017]).

SUMMARY

As described in Japanese Patent Laying-Open No. 2023-118569, for example, a vehicle having a so-called liquid-cooling-type thermal management system mounted thereon has been proposed. The thermal management system includes a pump that circulates a heat medium that exchanges heat with a battery. The thermal management system can be used not only for cooling of the battery but also for heating (raising the temperature) of the battery.

Generally, a temperature range suitable for charging/discharging exists in a battery (typically, a secondary battery). Prior to charging/discharging of the battery, the temperature of the battery may be raised. Raising the temperature of the battery in advance can make a charging power to the battery larger than that when the temperature of the battery is low, which leads to shortening of the charging time of a vehicle. In addition, raising the temperature of the battery in advance can make a discharging power from the battery larger than that when the temperature of the battery is low, which leads to improvement of the traveling performance of the vehicle. As described above, raising the temperature of the battery contributes to improvement of marketability of the vehicle. The marketability of the vehicle refers to attractiveness of the vehicle as a product and/or fitness for customer needs.

The present inventors have focused on the fact that the following problem may occur when the temperature of a battery is raised. When the temperature of the battery is raised, a noise caused by driving of a pump may occur. This noise will be hereinafter referred to as "pump noise". The pump noise may deteriorate the marketability of the vehicle. That is, although raising the temperature of the battery improves the marketability of the vehicle by shortening of the charging/discharging time of the battery and the like, raising the temperature of the battery may deteriorate the marketability of the vehicle due to the occurrence of the pump noise. It is desirable to balance required temperature-raising and suppression of the pump noise.

(1) A vehicle according to an aspect of the present disclosure includes: a battery; a thermal management system; and a controller. The thermal management system includes a pump that circulates a heat medium that exchanges heat with the battery. The thermal management system performs thermal management in the vehicle. The controller controls the thermal management system. When a temperature of the battery is raised using the thermal management system, the controller controls the pump such that a pump noise is suppressed when a prescribed condition indicating that a background noise is small is satisfied as compared with when the prescribed condition is not satisfied, the pump noise being a noise caused by driving of the pump, the background noise being a noise caused by a device other than the pump.

In (1) above, when the temperature of the battery is raised and when the prescribed condition is satisfied and the background noise is small, the pump noise is suppressed. In other words, when the background noise is large, suppression of the pump noise is not performed. This means that when the background noise is large, a higher priority is given to heating of the battery than suppression of the pump noise. The reason for this is that even when the pump noise occurs, the pump noise is buried in the background noise and thus the pump noise is less likely to cause annoyance and discomfort. Therefore, required heating and appropriate suppression of the pump noise can be both achieved.

(2) The pump is an electric pump in which a flow rate of the heat medium is determined in accordance with a drive frequency. The controller sets the drive frequency regardless of a resonance band of the electric pump when the prescribed condition is not satisfied, and sets the drive frequency to be outside the resonance band when the prescribed condition is satisfied.

(3) The controller controls the drive frequency by outputting a pulse width modulation (PWM) signal to the electric pump. When the prescribed condition is satisfied, the controller sets a duty of the PWM signal such that the drive frequency becomes lower than a lower limit of the resonance band.

In (2) and (3) above, when the prescribed condition is satisfied and the background noise is small, the drive frequency of the electric pump is set to be outside the resonance band (e.g., to be lower than the lower limit of the resonance band). As a result, the resonance of the electric pump can be prevented and the pump noise can be appropriately suppressed.

(4) The vehicle is configured to perform external power feeding from the battery to an external device of the vehicle. When the external power feeding is performed, the controller controls the pump such that the pump noise is suppressed as compared with when the external power feeding is not performed.

When the external power feeding is performed (e.g., when V2H is performed in a user's home), the pump noise may bother a user and constitute a nuisance to the neighborhood. In (4) above, when the external power feeding is performed, the pump noise can be appropriately suppressed.

(5) The vehicle is configured to charge the battery from a charging facility external to the vehicle. When a charging power to the vehicle is smaller than a reference power, the controller controls the pump such that the pump noise is suppressed as compared with when the charging power is larger than the reference power.

When the charging power is larger than the reference power, the charging facility itself generates the background noise (mainly, a cooling sound of the charging facility), and thus, the pump noise is buried in the background noise of the charging facility and becomes negligible. In (5) above, when the charging power is smaller than the reference power and the background noise is small, the pump noise can be appropriately suppressed.

(6) When a user operation for requesting quick heating of the battery is performed, the controller controls the pump such that suppression of the pump noise is not performed.

When the user operation for requesting quick heating of the battery is performed, there may be a user's intention to immediately raise the temperature of the battery and bring the battery into a state suitable for charging. In (6) above, when the user operation for requesting quick heating of the battery is performed, a higher priority is given to raising the temperature of the battery than suppression of the pump noise. As a result, the user's intention can be respected.

(7) When a traveling speed of the vehicle is lower than a specified speed, the controller controls the pump such that the pump noise is suppressed as compared with when the traveling speed is higher than the specified speed.

When the traveling speed of the vehicle is higher than the specified speed, the pump noise is buried in a traveling noise such as a road noise and a wind noise and becomes negligible. In (7) above, when the traveling speed of the vehicle is lower than the specified speed and there is no traveling noise, the pump noise can be appropriately suppressed.

(8) The thermal management system further includes a compressor of an air conditioner. When the compressor is not in operation, the controller controls the pump such that the pump noise is suppressed as compared with when the compressor is in operation.

(9) The thermal management system further includes a blower of a radiator. When the blower is not in operation, the controller controls the pump such that the pump noise is suppressed as compared with when the blower is in operation.

When the compressor or the blower is in operation, the pump noise is buried in an operation sound of the compressor or the blower and becomes negligible. In (8) and (9) above, when the compressor or the blower is not in operation and there is no operation sound, the pump noise can be appropriately suppressed.

(10) In a controller of a vehicle according to another aspect of the present disclosure, the vehicle has a thermal management system mounted thereon, the thermal management system including a pump that circulates a heat medium that exchanges heat with a battery. The controller includes a processor. When a temperature of the battery is raised using the thermal management system, the processor suppresses a pump noise when a prescribed condition indicating that a background noise is small is satisfied as compared with when the prescribed condition is not satisfied, the pump noise being a noise caused by driving of the pump, the background noise being a noise caused by a device other than the pump.

(11) In a control method for a vehicle according to still another aspect of the present disclosure, the vehicle has a thermal management system mounted thereon, the thermal management system including a pump that circulates a heat medium that exchanges heat with a battery. The control method includes raising a temperature of the battery using the thermal management system. The raising includes suppressing a pump noise when a prescribed condition indicating that a background noise is small is satisfied as compared with when the prescribed condition is not satisfied, the pump noise being a noise caused by driving of the pump, the background noise being a noise caused by a device other than the pump.

According to (10) and (11) above, required heating of the battery and appropriate suppression of the pump noise can be both achieved, similarly to (1) above.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 6 is a flowchart showing an example of a process procedure about setting of the duty of the PWM signal in the first embodiment.

FIG. 7 is a flowchart showing an example of a process procedure about setting of a duty of a PWM signal in a modification of the first embodiment.

FIG. 8 is a flowchart showing an example of a process procedure about setting of a duty of a PWM signal in a second embodiment.

DESCRIPTION OF THE PREFERRED EMBODIMENTS

Figure 1:
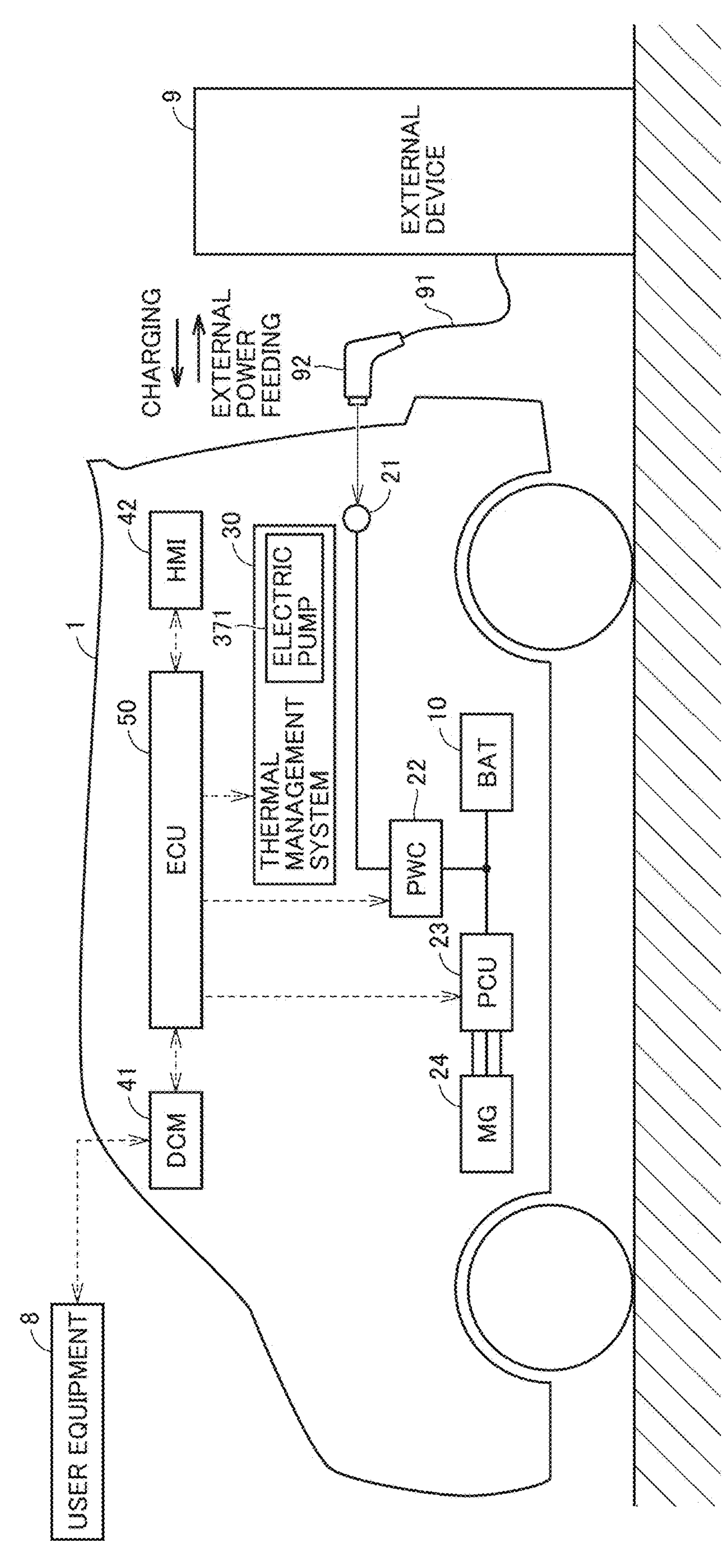
FIG. 1 is a diagram showing an example of an overall configuration of a vehicle according to a first embodiment.

Hereinafter, embodiments of the present disclosure will be described in detail with reference to the drawings, in which the same or corresponding portions are denoted by the same reference characters and description thereof will not be repeated.

Description of Terms

In the present disclosure and the embodiments thereof, "charging/discharging" of a battery may refer to only charging, or may refer to only discharging (power feeding), or may refer to both charging and discharging.

First Embodiment

Configuration of Vehicle

Overall Configuration

FIG. 1 is a diagram showing an example of an overall configuration of a vehicle according to a first embodiment. A vehicle 1 is a vehicle having a battery for traveling mounted thereon. In the present embodiment, vehicle 1 is a battery electric vehicle (BEV) or a plug-in hybrid electric vehicle (PHEV). However, vehicle 1 may be an ordinary hybrid electric vehicle (HEV), or may be a fuel cell electric vehicle (FCEV).

An example in which vehicle 1 is a BEV will be described below. Vehicle 1 is configured to be connectable to an external device 9 provided external to vehicle 1. External device 9 may be a charging facility that supplies electric power for charging vehicle 1. The charging facility may be a facility that performs AC charging (normal charging), or may be a facility that performs DC charging (quick charging). External device 9 may be an electric facility that receives external power feeding from vehicle 1. The electric facility may be a house in which V2H (Vehicle to Home) is performed, or may be another vehicle in which V2V (Vehicle to Vehicle) is performed, or may be an electric device in which V2L (Vehicle to Load) is performed. A cable 91 for power transmission is used to connect vehicle 1 and external device 9. A connector 92 is provided at a tip end of cable 91.

Vehicle 1 includes a battery 10, an inlet 21, a power converter 22, a power control unit (PCU) 23, a motor generator 24, a thermal management system 30, a digital communication module (DCM) 41, a human machine interface (HMI) 42, and an electronic control unit (ECU) 50.

Battery 10 is a secondary battery, and is typically a liquid-based secondary battery. In this example, battery 10 is a lithium ion battery. Battery 10 may be another type of liquid-based secondary battery (such as a nickel-metal hydride battery). Battery 10 may be an all-solid-state battery. Although not shown, battery 10 is provided with sensors (a voltage sensor, a current sensor and a temperature sensor) for monitoring a state of battery 10.

Inlet 21 has such a shape that connector 92 of cable 91 for power transmission can be attached thereto. Power converter 22 performs power conversion (DC/AC conversion or DC/DC conversion) between inlet 21 and battery 10 in accordance with a control command from ECU 50. PCU 23 includes an inverter and is configured to allow bidirectional conversion between DC power of battery 10 and AC power of motor generator 24 in accordance with a control command from ECU 50. Motor generator 24 is a drive source that drives a driving wheel of vehicle 1 using electric power supplied from PCU 23, and is a three-phase AC rotating electric machine, for example.

Thermal management system 30 performs thermal management for cooling or heating the components of vehicle 1, in accordance with a control command from ECU 50. Thermal management system 30 includes an electric pump 371 that circulates a heat medium that exchanges heat with battery 10. A configuration of thermal management system 30 will be described in detail with reference to FIGS. 2 and 3.

Digital communication module 41 is configured to be capable of bidirectionally communicating with user equipment 8 provided outside vehicle 1. User equipment 8 is a smartphone, a tablet, a personal computer (PC) or the like. Digital communication module 41 outputs a signal indicating a user operation on user equipment 8 to ECU 50.

HMI 42 is typically a touch panel of a navigation system. HMI 42 may be a physical switch provided around a driver's seat. HMI 42 receives a user operation and outputs a signal indicating the user operation to ECU 50.

ECU 50 controls the components of vehicle 1 such that vehicle 1 has a desired state, based on signals from various sensors and information such as maps and programs stored in a memory. For example, during charging of vehicle 1, ECU 50 controls power converter 22 such that electric power is appropriately charged from external device 9 to vehicle 1, while communicating with a control unit in external device 9 (charging facility) through cable 91. During external power feeding of vehicle 1, ECU 50 controls power converter 22 such that electric power is appropriately supplied from vehicle 1 to external device 9 (such as a house). During traveling of vehicle 1, ECU 50 controls PCU 23 such that required driving force is output. Simultaneously with these controls, ECU 50 determines whether it is necessary to cool or raise the temperature of battery 10, based on signals from the voltage sensor, the current sensor and the temperature sensor of battery 10. When it is necessary to cool or raise the temperature of battery 10, ECU 50 controls thermal management system 30 such that the temperature of battery 10 is adjusted (changed and maintained) to fall within an appropriate temperature range. The controls by ECU 50 will also be described in detail below. ECU 50 corresponds to "controller" according to the present disclosure.

Configuration of Thermal Management System

Figure 2:
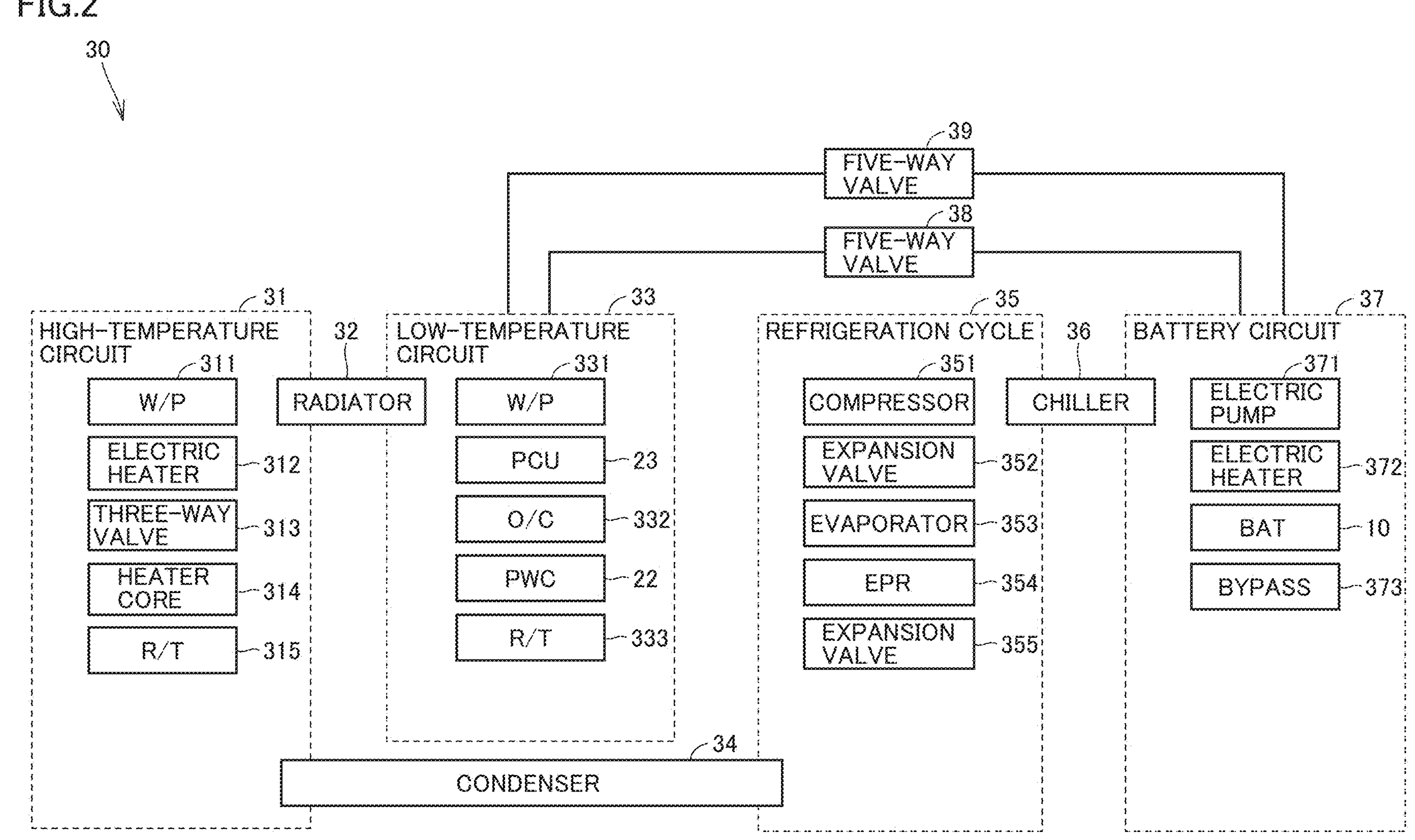
FIG. 2 is a diagram showing an example of an overall configuration of a thermal management system.

FIG. 2 is a diagram showing an example of an overall configuration of thermal management system 30. Thermal management system 30 includes a circuit configured to cause a long life coolant (LLC) that exchanges heat with the components of vehicle 1 to flow (circulate). The LLC is an example of "heat medium" according to the present disclosure. "Heat medium" may be another type of liquid (such as water).

Thermal management system 30 includes, for example, a high-temperature (HT) circuit 31, a radiator 32, a low-temperature (LT) circuit 33, a condenser 34, a refrigeration cycle 35, a chiller 36, a battery circuit 37, and five-way valves 38 and 39.

HT circuit 31 includes, for example, a water pump 311, an electric heater 312, a three-way valve 313, a heater core 314, and a reservoir tank 315. Radiator 32 is connected to (in other words, shared by) both HT circuit 31 and LT circuit 33. LT circuit 33 includes, for example, a water pump 331, PCU 23, an oil cooler 332, power converter 22, and a reservoir tank 333. Condenser 34 is connected to both HT circuit 31 and refrigeration cycle 35. Refrigeration cycle 35 includes, for example, a compressor 351, an expansion valve 352, an evaporator 353, an evaporative pressure regulator (EPR) 354, and an expansion valve 355. Chiller 36 is connected to both refrigeration cycle 35 and battery circuit 37. Battery circuit 37 includes, for example, electric pump 371, an electric heater 372, battery 10, and a bypass path 373. Each of five-way valve 38 and five-way valve 39 is connected to LT circuit 33 and battery circuit 37.

Figure 3:
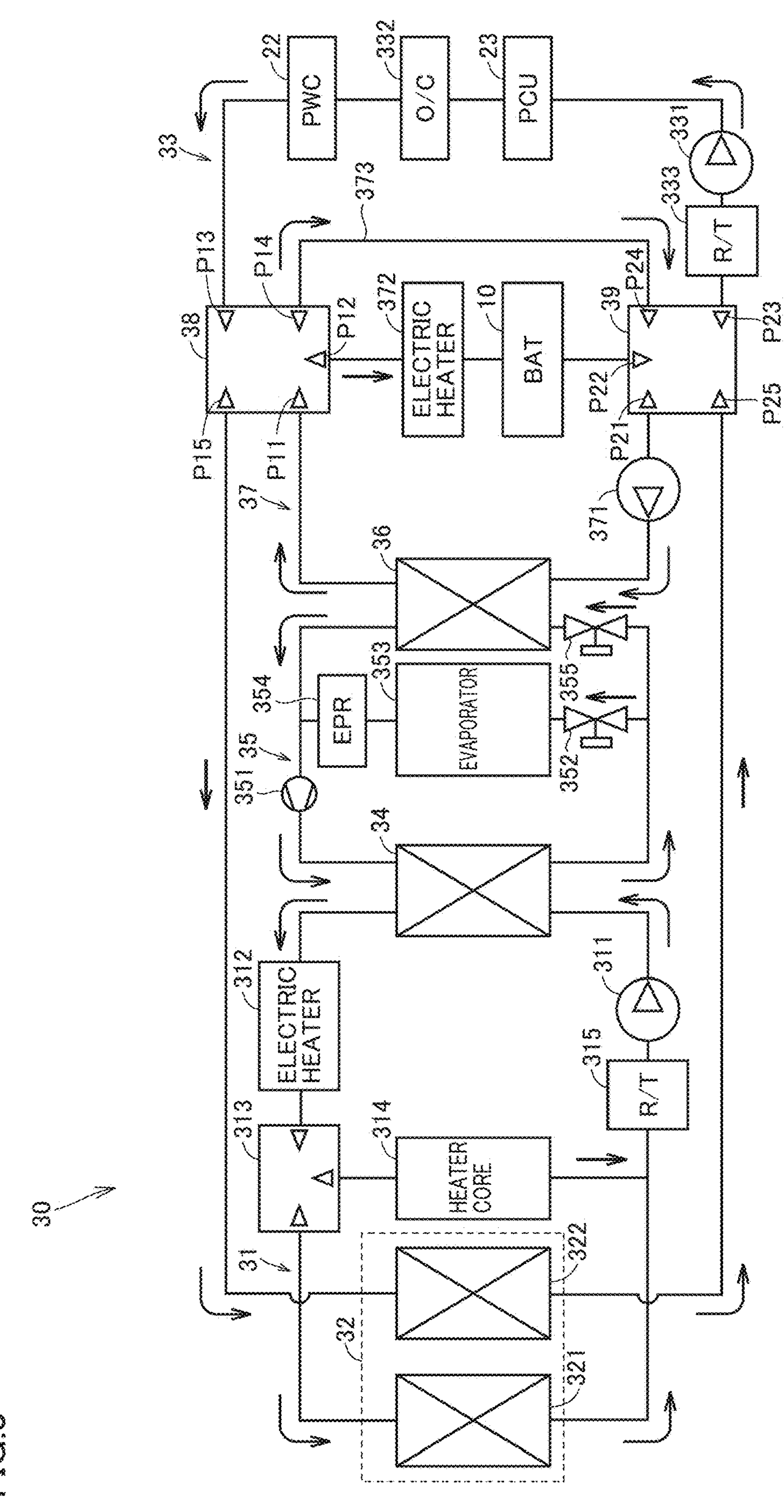
FIG. 3 is a diagram showing an example of a detailed configuration of the thermal management system.

FIG. 3 is a diagram showing an example of a detailed configuration of thermal management system 30. HT circuit 31 includes a first path and a second path. The first path connects water pump 311, condenser 34, electric heater 312, three-way valve 313, heater core 314, reservoir tank 315, and water pump 311 in this order. The second path connects water pump 311, condenser 34, electric heater 312, three-way valve 313, high-temperature radiator 321, reservoir tank 315, and water pump 311 in this order. Three-way valve 313 switches a flow path of the heat medium such that the heat medium flows through at least one of the first path and the second path.

Water pump 311 circulates the heat medium in HT circuit 31 in accordance with a control command from ECU 50. Condenser 34 causes heat exchange between the heat medium and a working medium in refrigeration cycle 35. Electric heater 312 heats the heat medium. Heater core 314 heats the air supplied to a vehicle compartment of vehicle 1 by heat exchange with the heat medium. High-temperature radiator 321 is provided with an electric fan (not shown) for blowing air when a traveling wind is not obtained. Reservoir tank 315 stores a part of the heat medium in HT circuit 31, thereby maintaining a pressure and an amount of the heat medium in HT circuit 31.

The heat medium in LT circuit 33 circulates through water pump 331, PCU 23, oil cooler 332, power converter 22, five-way valve 38, low-temperature radiator 322, five-way valve 39, reservoir tank 333, and water pump 331 in this order.

Water pump 331 circulates the heat medium in LT circuit 33 in accordance with a control command from ECU 50. Oil cooler 332 circulates a lubricating oil for a motor by using an electrical oil pump (EOP) (not shown). PCU 23, oil cooler 332 and power converter 22 are cooled by the heat medium circulating in LT circuit 33. Reservoir tank 333 stores a part of the heat medium in LT circuit 33, thereby maintaining a pressure and an amount of the heat medium in LT circuit 33. Each of five-way valve 38 and five-way valve 39 switches a flow path of the heat medium in each of LT circuit 33 and battery circuit 37 in accordance with a control command from ECU 50. Low-temperature radiator 322 is disposed in the vicinity of high-temperature radiator 321 such that the heat medium flowing in low-temperature radiator 322 exchanges heat with the heat medium flowing in high-temperature radiator 321. Low-temperature radiator 322 is provided with an electric fan (not shown), similarly to high-temperature radiator 321.

Refrigeration cycle 35 includes a first path and a second path. The first path connects compressor 351, condenser 34, expansion valve 352, evaporator 353, EPR 354, and compressor 351 in this order. The second path connects compressor 351, condenser 34, expansion valve 355, chiller 36, and compressor 351 in this order. Each of expansion valve 352 and expansion valve 355 switches a flow path of the working medium such that the working medium in refrigeration cycle 35 flows through at least one of the first path and the second path.

Compressor 351 compresses the gas-phase working medium flowing out of chiller 36. Condenser 34 condenses the working medium by heat exchange between the gas-phase working medium discharged from compressor 351 and the heat medium flowing through HT circuit 31. Expansion valve 352 expands the working medium flowing out of condenser 34. Evaporator 353 evaporates the working medium by heat exchange between the working medium flowing out of expansion valve 352 and the air supplied to the vehicle compartment of the electrically powered vehicle. EPR 354 adjusts a pressure of the working medium flowing out of evaporator 353. Expansion valve 355 expands the working medium flowing out of condenser 34.

Battery circuit 37 includes a first path and a second path. The first path connects electric pump 371, chiller 36, five-way valve 38, electric heater 372, battery 10, five-way valve 39, and electric pump 371 in this order. The second path connects electric pump 371, chiller 36, five-way valve 38, bypass path 373, five-way valve 39, and electric pump 371 in this order. Each of five-way valve 38 and five-way valve 39 switches a flow path of the heat medium such that the heat medium flows through at least one of the first path and the second path.

Electric pump 371 circulates the heat medium in battery circuit 37 in accordance with a control command from ECU 50. More specifically, electric pump 371 in the present embodiment includes a not-shown rotating body and is PWM (pulse width modulation)-controlled. ECU 50 controls a drive frequency f of electric pump 371 by setting a duty of a PWM signal. Electric pump 371 sends out a discharge amount of the heat medium corresponding to drive frequency f. As drive frequency f of electric pump 371 becomes higher, the discharge amount of the heat medium becomes larger.

Electric pump 371 corresponds to "pump" according to the present disclosure. A method for controlling "pump" is not limited to PWM control. "Pump" may be controlled by another control method such as proportional-integral-differential (PID) control or vector control. "Pump" is not limited to a rotary pump, and may be a reciprocating pump (a pump in which the reciprocating motion causes a volume change in a cylinder).

Chiller 36 cools the heat medium circulating in battery circuit 37 by heat exchange between the working medium circulating in refrigeration cycle 35 and the heat medium circulating in battery circuit 37. Electric heater 372 heats the heat medium in accordance with a control command from ECU 50. As described above, battery 10 is heated using electric heater 372 and cooled using chiller 36. Bypass path 373 connects five-way valve 38 and five-way valve 39 such that the heat medium bypasses electric heater 372 and battery 10.

Five-way valve 38 is provided with five ports P11 to P15. Port P11 is an inlet port through which the heat medium flows in from chiller 36. Port P12 is an outlet port through which the heat medium flows out toward electric heater 372 and battery 10 of battery circuit 37. Port P13 is an inlet port through which the heat medium having passed through PCU 23, oil cooler 332 and power converter 22 flows in. Port P14 is an outlet port through which the heat medium flows out toward bypass path 373 of battery circuit 37. Port P15 is an outlet port through which the heat medium flows out toward low-temperature radiator 322.

Five-way valve 39 is provided with five ports P21 to P25. Port P21 is an outlet port through which the heat medium flows out toward chiller 36. Port P22 is an inlet port through which the heat medium having passed through electric heater 372 and battery 10 of battery circuit 37 flows in. Port P23 is an outlet port through which the heat medium flows out toward PCU 23, oil cooler 332 and power converter 22. Port P24 is an inlet port through which the heat medium flows in from bypass path 373 of battery circuit 37. Port P25 is an inlet port through which the heat medium flows in from low-temperature radiator 322.

Although not shown, a blower (such as a fan and an air blower) for air-cooling PCU 23 may be provided. The same also applies to battery 10.

Configuration of ECU

Figure 4:
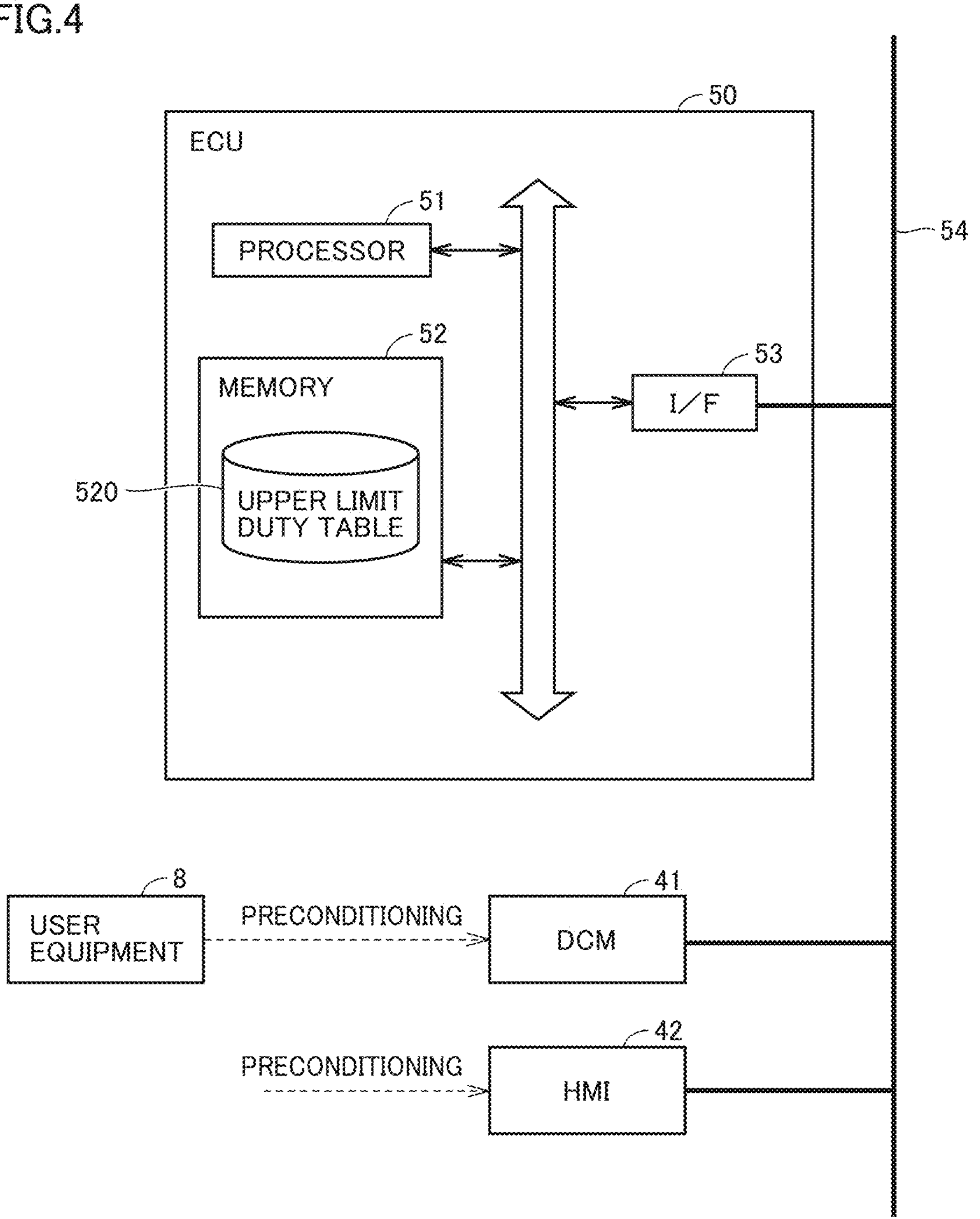
FIG. 4 is a diagram showing an example of a configuration of an ECU.

FIG. 4 is a diagram showing an example of a configuration of ECU 50. ECU 50 includes a processor 51, a memory 52 and an interface 53. The components of ECU 50 are connected to digital communication module 41 and HMI 42 through a bus 54.

Processor 51 is an arithmetic processing unit such as a central processing unit (CPU) or a micro-processing unit (MPU). Memory 52 may include a volatile memory such as a random access memory (RAM), and a rewritable nonvolatile memory such as a solid state drive (SSD) or a flash memory. Memory 52 stores a system program including an operating system (OS), and a control program including computer readable codes required for arithmetic processing. Memory 52 further stores a table (upper limit duty table) for setting an upper limit duty described below. Processor 51 reads the system program and the control program, loads the system program and the control program onto memory 52, thereby implementing various processes. Interface 53 controls communication between ECU 50 and digital communication module 41 and HMI 42, and controls communication between ECU 50 and the components of thermal management system 30.

ECU 50 may be divided into a plurality of ECUs for each function. Although FIG. 4 shows the example in which ECU 50 includes one processor 51, ECU 50 may include a plurality of processors. The same also applies to memory 52.

In the present specification, "processor" is not limited to a processor in a narrow sense that performs processing in a stored program scheme, and may include a hardwired circuit such as an application specific integrated circuit (ASIC) or a field-programmable gate array (FPGA). Therefore, the term "processor" can also be interchangeably read as processing circuitry for which processing is defined in advance by computer readable codes and/or a hardwired circuit.

Raising Temperature of Battery

In vehicle 1, when the temperature of battery 10 is low (a temperature at which charging/discharging of battery 10 is restricted, such as a temperature below the freezing point), "quick heating request" for quickly heating battery 10 is generated. Raising the temperature of battery 10 in advance using thermal management system 30 prior to charging of vehicle 1 can make a charging power to battery 10 larger than that when the temperature of battery 10 is low. This leads to shortening of the charging time of vehicle 1. Moreover, heating battery 10 in advance using thermal management system 30 prior to external power feeding from vehicle 1 can make electric power supplied from battery 10 larger than that when the temperature of battery 10 is low. As a result, the electric power from vehicle 1 can be supplied to a larger number of electric devices in a house, for example.

In addition, vehicle 1 according to the present embodiment has a preconditioning mode. When the preconditioning mode is selected by a user, the quick heating request is generated even under a condition where the quick heating request is not automatically generated. This can cause thermal management system 30 to operate before the use of vehicle 1 (such as before charging, before external power feeding, or before traveling), to raise the temperature of battery 10 in advance, such that the temperature of battery 10 is within a temperature range suitable for charging/discharging when vehicle 1 is used.

The user can select the preconditioning mode by an operation on HMI 42 (i.e., an operation in the vehicle compartment). It allows heating of battery 10 to be started at the desired timing regardless of a condition where the quick heating request is automatically generated. The user can also select the preconditioning mode by an operation on user equipment 8. It allows heating of battery 10 to be started even when vehicle 1 is parked at a position distant from the current location of the user.

Occurrence of Pump Noise

The present inventors have focused on the fact that the following problem may occur when the temperature of battery 10 is raised in response to the generation of the quick heating request. When the temperature of battery 10 is raised, a noise caused by driving of electric pump 371 of battery circuit 37 may occur. More specifically, using a fixing hardware (such as a bracket), electric pump 371 is fixed to a not-shown housing that houses battery circuit 37. As described above, electric pump 371 is configured such that as drive frequency f becomes higher, the discharge amount of the heat medium becomes larger. In order to increase the discharge amount of the heat medium, it is necessary to increase drive frequency f. When drive frequency f is increased, resonance between electric pump 371 and the member to which electric pump 371 is fixed (the housing or the fixing hardware) occurs depending on drive frequency f, which may cause a noise. This noise will be referred to as "pump noise". The pump noise includes both N and V of electric pump 371, i.e., not only N (noise) but also V (vibration).

Although heating of battery 10 improves the marketability of vehicle 1 by shortening of the charging time of battery 10 and the like, heating of battery 10 may deteriorate the marketability of vehicle 1 due to the occurrence of the pump noise (so-called deterioration of the NV performance). It is desirable to ensure a high level of marketability by enjoying the advantages such as shortening of the charging time offered by required heating and appropriately suppressing the disadvantage of the pump noise.

Thus, in the present embodiment, ECU 50 determines drive frequency f of electric pump 371 in consideration of a condition where a background noise occurs. The background noise refers to a noise caused by a device other than electric pump 371 (i.e., a noise other than the pump noise). When the background noise is large, the pump noise is buried in the background noise and becomes negligible. Therefore, the temperature of battery 10 can be raised without particularly considering suppression of the pump noise. On the other hand, when the background noise is small, the pump noise may cause annoyance, and thus, it is desirable to give a higher priority to suppression of the pump noise than heating of battery 10. As described above, when a prescribed condition (described below) indicating that the background noise is small is satisfied, ECU 50 suppresses the pump noise as compared with when the condition is not satisfied.

Driving of Electric Pump

As described above, ECU 50 in the present embodiment controls drive frequency f of electric pump 371 by setting a duty D of the PWM signal for driving electric pump 371.

Figure 5:
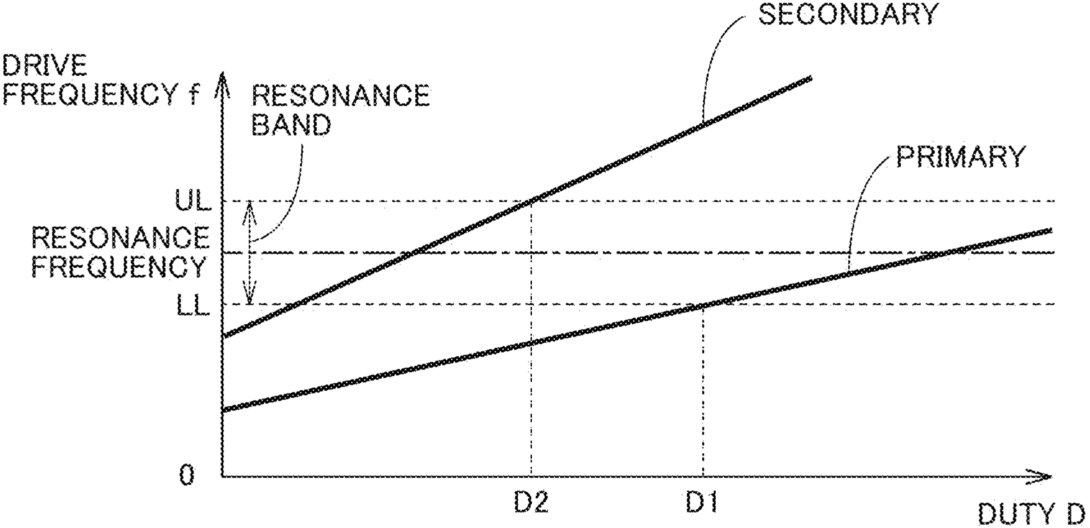
FIG. 5 is a conceptual diagram showing a relationship between a duty of a PWM signal and a drive frequency of an electric pump.

FIG. 5 is a conceptual diagram showing a correspondence relationship between duty D of the PWM signal and drive frequency f of electric pump 371. The horizontal axis represents duty D of the PWM signal. The vertical axis represents drive frequency f of electric pump 371.

There are a plurality of natural vibration modes (characteristic vibration modes) in electric pump 371. FIG. 5 shows a correspondence relationship indicating a primary natural vibration mode, and a correspondence relationship indicating a secondary natural vibration mode. Although not shown for the sake of brevity, generally, there are also correspondence relationships indicating higher-order (tertiary and quaternary) natural vibration modes.

When drive frequency f of electric pump 371 matches a resonance frequency, resonance occurs and the pump noise occurs. In the present embodiment, a resonance band including the resonance frequency is set in consideration of tolerance variations of electric pump 371 (tolerance variations of electric pump 371 itself and tolerance variations related to how to fix electric pump 371). An upper limit of the resonance band will be denoted as "UL", and a lower limit will be denoted as "LL". When drive frequency f is within the resonance band, resonance of electric pump 371 may occur. On the other hand, when drive frequency f is outside the resonance band, resonance of electric pump 371 can be prevented.

When the background noise is small, duty D of the PWM signal is set such that drive frequency f of electric pump 371 does not fall within the resonance band. In the example shown in FIG. 5, by setting duty D to be less than D1, resonance (primary resonance) caused by the primary natural vibration mode of electric pump 371 can be prevented. As a result, the pump noise can be suitably suppressed.

However, when duty D is set to be less than D2, resonance (secondary resonance) caused by the secondary natural vibration mode of electric pump 371 may occur. Although the secondary resonance is weaker than the primary resonance, the user may sense the secondary resonance. Therefore, duty D may be set to fall within a range of more than D2 and less than D1 in order to prevent both the primary resonance and the secondary resonance.

The example in which duty D is set such that drive frequency f becomes lower than lower limit LL of the resonance band has been described. However, in order to prevent resonance of electric pump 371, drive frequency f may only be outside the resonance band. Therefore, depending on the correspondence relationship between duty D and drive frequency f, duty D may be set such that drive frequency f becomes higher than upper limit UL of the resonance band.

Process Flow

A process procedure about setting of the duty of the PWM signal for driving electric pump 371 will be described in detail below.

FIG. 6 is a flowchart showing an example of a process procedure about setting of the duty of the PWM signal in the first embodiment. The process shown in this flowchart is performed when a predetermined condition is satisfied (e.g., every prescribed cycle during driving of electric pump 371). Although each step is implemented by software processing by ECU 50 (processor 51 shown in FIG. 4), each step may be implemented by hardware (electrical circuit) disposed in ECU 50. Hereinafter, the step will be abbreviated as "S". The same also applies to the processes shown in the other flowcharts described below.

It is assumed that a process described below is performed in another not-shown flowchart. First, ECU 50 calculates a flow rate (requested flow rate) of the heat medium for adjusting a temperature of a device (such as battery 10 or PCU 23) to be managed by thermal management system 30 to a target temperature. ECU 50 calculates drive frequency f (requested frequency) of electric pump 371 corresponding to the requested flow rate, and further, calculates a duty (requested duty) of the PWM signal for achieving the requested frequency. ECU 50 temporarily stores the calculated requested duty in memory 52 (see FIG. 4).

In the present embodiment, ECU 50 is configured to set the duty of the PWM signal such that the duty does not exceed an upper limit serving as a so-called guard value. This process will be hereinafter referred to as "upper limit guard". The upper limit set for duty D will be denoted as "upper limit duty".

Referring to FIGS. 1 to 3 and 6, in S101, ECU 50 determines whether a quick cooling request for battery 10 has been generated. The quick cooling request is generated mainly when the temperature of battery 10 exceeds a warning temperature indicating an excessive increase in temperature of battery 10 (a temperature at which it is desirable to immediately cool battery 10 from the perspective of protecting battery 10).

When the quick cooling request has been generated (YES in S101), ECU 50 moves the process to S110 and sets the requested duty stored in memory 52 as duty D of the PWM signal. That is, ECU 50 sets duty D without considering the resonance band of electric pump 371. The upper limit guard is not performed, either.

When the quick cooling request has not been generated (NO in S101), ECU 50 determines whether the quick heating request for battery 10 has been generated (S102). The quick heating request is automatically generated mainly when the temperature of battery 10 is lower than a predetermined reference temperature. In addition, the quick heating request may also be generated as a result of the user operation on user equipment 8 or HMI 42.

When the quick heating request has not been generated (NO in S102), ECU 50 moves the process to S103 and sets an upper limit duty Dlim0 based on the assumption that heating of battery 10 is not performed. Dlim0 is set regardless of the resonance frequency (resonance band) of electric pump 371.

When the quick heating request has been generated (YES in S102), ECU 50 determines whether to suppress the pump noise in the subsequent processing in S104 to S109. In other words, ECU 50 determines whether to give a higher priority to heating of battery 10 or to suppression of the pump noise. In the present embodiment, it is determined whether the below-described three conditions are satisfied.

The first condition is about external power feeding of vehicle 1. As described above, the external power feeding includes V2H, V2V, V2L and the like. For example, when V2H is performed in a home of the user of vehicle 1, the pump noise may bother the user that is at home. The pump noise may also constitute a nuisance to the neighborhood. The same problem may occur in V2V, V2L and the like. Therefore, it is desirable to suppress the pump noise during the external power feeding.

The second condition is about charging of vehicle 1. Generally, a liquid-cooling-type cooling system is built into a DC charging (quick charging) facility and the cooling system makes a loud driving sound. A liquid-cooling-type cooling system is also built into a large-power charging facility (e.g., a charging facility whose charging power is equal to or more than 22 kW and which is placed in a commercial facility or the like), among AC charging (normal charging) facilities, and the cooling system makes a loud driving sound. When vehicle 1 is charged using such a charging facility, the pump noise is less likely to become a problem even when the pump noise occurs. In contrast, a smaller-power AC charging facility (e.g., a charging facility whose charging power is equal to or less than 3 kW and which is placed in a general household) does not include a liquid-cooling-type cooling system and makes only a small driving sound. Therefore, the pump noise may constitute a nuisance to the surroundings (typically, the home and the neighborhood). Thus, it is desirable to suppress the pump noise during AC charging with a small charging power as well.

The third condition is about preconditioning of vehicle 1. Selecting the preconditioning mode means that the user desires heating of battery 10. There may be various reasons for this. One typical reason is that the user is planning to go out and thus wants to finish charging of battery 10 in a short time. Therefore, it is desirable to immediately raise the temperature of battery 10 in accordance with the user's intention.

In S104, ECU 50 determines whether the external power feeding of vehicle 1 is performed (is being performed). In accordance with cable 91 connected to inlet 21, ECU 50 can determine whether the external power feeding is performed.

When the external power feeding is performed (YES in S104), ECU 50 sets the upper limit duty of the PWM signal to Dlim1 such that drive frequency f of electric pump 371 becomes lower than lower limit LL of the resonance band in this example (S105). Dlim1 is preset at the time of shipping of vehicle 1, assuming the type of the external power feeding of vehicle 1 (e.g., V2H), and is stored in upper limit duty table 520 (see FIG. 4). Dlim1 can, for example, be adaptively set such that the pump noise can be appropriately suppressed and the required electric power can be supplied in many cases of V2H. Thereafter, ECU 50 moves the process to S111 and performs the upper limit guard. That is, ECU 50 controls duty D of the PWM signal within a range in which duty D does not exceed upper limit duty Dlim1.

When the external power feeding is not performed (NO in S104), ECU 50 determines whether AC charging with a charging power that is less than a reference power REF is performed (is being performed) (S106). Reference power REF may be set to a power that is more than 3 kW and less than 22 kW (e.g., 15 kW) in the above-described example. ECU 50 can determine whether the charging power is less than reference power REF, based on communication with external device 9 (AC charging facility) through cable 91. Hereinafter, AC charging with the charging power that is less than reference power REF will be denoted as "small-power AC charging".

When the small-power AC charging is performed (YES in S106), ECU 50 sets the upper limit duty to Dlim2 such that drive frequency f becomes lower than lower limit LL of the resonance band (S107). Dlim2 is preset at the time of shipping of vehicle 1, assuming the type of the AC charging of vehicle 1 (e.g., charging in a general household), and is stored in upper limit duty table 520 (see FIG. 4). Dlim2 can, for example, be adaptively set such that the pump noise can be appropriately suppressed and the charging time can be prevented from becoming excessively longer with a reduction of the charging power, although the charging time becomes longer to a certain degree. Dlim2 may be equal to Dlim1, or may be different from Dlim1. ECU 50 performs the upper limit guard and controls duty D of the PWM signal within a range in which duty D does not exceed upper limit duty Dlim2 (S111).

When the small-power AC charging is not performed (NO in S106), ECU 50 determines whether vehicle 1 is in the preconditioning mode (S108).

When vehicle 1 is in the preconditioning mode (YES in S108), ECU 50 sets the upper limit duty of the PWM signal to Dlim3 such that the temperature of battery 10 can be immediately raised, regardless of whether drive frequency f of electric pump 371 falls within the resonance band (S109). Dlim3 is preset at the time of shipping of vehicle 1 in consideration of the heating performance requested for the preconditioning mode, and is stored in upper limit duty table 520 (see FIG. 4). ECU 50 performs the upper limit guard and controls duty D of the PWM signal within a range in which duty D does not exceed upper limit duty Dlim3 (S111).

When vehicle 1 is not in the preconditioning mode (NO in S108), i.e., when neither the external power feeding nor the small-power AC charging of vehicle 1 is performed and vehicle 1 is not in the preconditioning mode, ECU 50 moves the process to S110 and sets the requested duty stored in memory 52 as duty D of the PWM signal.

It is conceivable to control electric pump 371 such that the pump noise is always suppressed without using the resonance band of electric pump 371. In that case, however, the setting range of drive frequency f is restricted even under a situation in which the occurrence of the pump noise does not become a problem, which may lead to excessive slow raising of the temperature of battery 10.

In order to address this, in the first embodiment, when the external power feeding or the small-power AC charging of vehicle 1 is performed, duty D of the PWM signal is adjusted such that drive frequency f of electric pump 371 does not fall within the resonance band, whereby the pump noise is suppressed. As a result, the temperature of battery 10 can be raised more immediately without unnecessarily suppressing the pump noise. Therefore, according to the first embodiment, required heating of battery 10 and appropriate suppression of the pump noise can be both achieved. As a result, the marketability of vehicle 1 can be improved.

In addition, when vehicle 1 is in the preconditioning mode, a higher priority is given to heating of battery 10 than suppression of the pump noise. This leads to improvement of the user convenience, and thus, the marketability of vehicle 1 can be further improved.

Modification of First Embodiment

As described in the present modification, the order of determination of the above-described three conditions to set the upper limit duty may be changed.

FIG. 7 is a flowchart showing an example of a process procedure about setting of the duty of the PWM signal in a modification of the first embodiment. This flowchart is different from the flowchart in the first embodiment (see FIG. 6) in that this flowchart includes processing in S104A to S109A instead of the processing in S104 to S109.

Referring to FIGS. 1 to 3 and 7, when the quick heating request has been generated (YES in S102), ECU 50 determines whether the conditions for suppressing the pump noise are satisfied. In the present modification, first, in S104A, ECU 50 determines whether vehicle 1 is in the preconditioning mode.

When vehicle 1 is in the preconditioning mode (YES in S104A), ECU 50 gives a higher priority to heating of battery 10 and sets the upper limit duty of the PWM signal to Dlim3 regardless of whether drive frequency f of electric pump 371 falls within the resonance band (S105A).

When vehicle 1 is not in the preconditioning mode (NO in S104A), ECU 50 determines whether the external power feeding of vehicle 1 is performed (S106A). When the external power feeding is performed (YES in S106A), ECU 50 sets the upper limit duty to Dlim1 such that drive frequency f becomes lower than lower limit LL of the resonance band (S107A).

When the external power feeding is not performed (NO in S106A), ECU 50 determines whether the small-power AC charging is performed (S108A). When the small-power AC charging is performed (YES in S108A), ECU 50 sets the upper limit duty to Dlim2 such that drive frequency f becomes lower than lower limit LL of the resonance band (S109A).

When the small-power AC charging is not performed (NO in S108A), i.e., when vehicle 1 is not in the preconditioning mode and neither the external power feeding nor the small-power AC charging of vehicle 1 is performed, ECU 50 sets the requested duty stored in memory 52 as duty D of the PWM signal (S110).

Since the processing other than the above-described processing is the same as the corresponding processing in the first embodiment, description will not be repeated.

As described above, also in the modification of the first embodiment, the upper limit duty is set to Dlim1 or Dlim2, similarly to the first embodiment. These upper limit duties are set such that drive frequency f of electric pump 371 does not fall within the resonance band, in order to prevent the resonance caused by the natural vibration modes of electric pump 371. By performing the upper limit guard and controlling duty D of the PWM signal such that duty D does not exceed the upper limit duty, required heating of battery 10 and appropriate suppression of the pump noise can be both achieved. Therefore, the marketability of vehicle 1 can be improved.

Vehicle 1 shifts to the preconditioning mode in response to the operation by the user who desires to raise the temperature of battery 10. However, in the present modification, prior to determination as to the external power feeding and the small-power AC charging, it is determined whether vehicle 1 is in the preconditioning mode. When vehicle 1 is in the preconditioning mode, upper limit duty Dlim3 corresponding to preconditioning is set regardless of the situation of vehicle 1 such as the external power feeding or the small-power AC charging. Such first determination as to whether the preconditioning mode has been selected means that a highest priority is given to the user's intention. This leads to improvement of the user convenience, and thus, the marketability of vehicle 1 can be further improved.

The example in which it is determined whether the three conditions for suppressing the pump noise are satisfied has been described in the first embodiment (see FIG. 6) and the modification (see FIG. 7). However, a part of the three conditions may be omitted. In other words, ECU 50 may determine whether only one or two of the three conditions is/are satisfied, and set the upper limit duty based on the result of determination.

Second Embodiment

In a second embodiment, another condition about the background noise is further taken into consideration. Since a configuration of a vehicle according to the second embodiment is the same as the configuration of vehicle 1 according to the first embodiment (see FIGS. 1 to 4), description will not be repeated.

FIG. 8 is a flowchart showing an example of a process procedure about setting of the duty of the PWM signal in the second embodiment. This flowchart is different from the flowchart in the first embodiment (see FIG. 6) in that this flowchart further includes processing in S210.

Referring to FIGS. 1 to 3 and 8, in the processing in S203, S205, S207, and S209, ECU 50 sets the upper limit duty to Dlim0, Dlim1, Dlim2, or Dlim3, respectively, similarly to the first embodiment. Thereafter, ECU 50 moves the process to S210 and determines whether another background noise condition other than the external power feeding (S204) and the AC charging (S206) is satisfied.

More specifically, the other background noise condition may be satisfied when a vehicle speed (traveling speed of vehicle 1) is higher than a specified speed (e.g., 10 km per hour). When the vehicle speed is higher than the specified speed, a relatively large traveling noise (mainly, a road noise and a wind noise) occurs, and thus, the pump noise is buried in the traveling noise and becomes negligible.

The other background noise condition may be satisfied when a device other than electric pump 371 in thermal management system 30 is in operation. This condition is satisfied, for example, when compressor 351 of refrigeration cycle 35 is in operation. This condition may also be satisfied when the electric fan provided in radiator 32 (high-temperature radiator 321 and low-temperature radiator 322) is in operation. When the fan, the air blower and the like for air-cooling PCU 23 and/or battery 10 are provided, this condition may also be satisfied when the fan, the air blower and the like are in operation. When the device other than electric pump 371 is in operation, the pump noise is also buried in an operation sound of the device and becomes negligible. Compressor 351 of refrigeration cycle 35 corresponds to "compressor" according to the present disclosure. The electric fan of radiator 32 and the fan and the air blower for air-cooling correspond to "blower" according to the present disclosure.

When the other background noise condition is not satisfied (NO in S210), ECU 50 sets the duty of the PWM signal such that the duty does not exceed the upper limit duty set in the processing in any one of S203, S205, S207, and S209 (S212). That is, when the vehicle speed is lower than the specified speed, ECU 50 suppresses the pump noise as compared with when the vehicle speed is higher than the specified speed. In addition, when both compressor 351 and the electric fan and the like are not in operation, ECU 50 suppresses the pump noise as compared with when at least one of compressor 351 and the electric fan and the like is in operation.

On the other hand, when the other background noise condition is satisfied (YES in S210), the pump noise is less likely to cause annoyance, and thus, ECU 50 does not perform the upper limit guard. ECU 50 sets the duty of the PWM signal to the requested duty for achieving the requested frequency of electric pump 371 corresponding to the requested flow rate (S211).

As described above, also in the second embodiment, the upper limit duty is set to Dlim1 or Dlim2, similarly to the first embodiment. These upper limit duties are set such that the drive frequency of electric pump 371 does not fall within the resonance band, in order to prevent the resonance caused by the natural vibration modes of electric pump 371. By performing the upper limit guard and controlling duty D of the PWM signal such that duty D does not exceed the upper limit duty, required heating of battery 10 and appropriate suppression of the pump noise can be both achieved. Therefore, the marketability of vehicle 1 can be improved.

In the second embodiment, the upper limit guard is not performed when the other background noise condition is satisfied, unlike the first embodiment. The reason for this is that when the other background noise condition is satisfied, annoyance, discomfort and the like caused by the pump noise are relatively reduced. This means that a higher priority is given to heating of battery 10 than suppression of the pump noise. Therefore, the temperature of battery 10 can be raised more immediately, and thus, the marketability of vehicle 1 can be further improved.

Although not shown, the modification (see FIG. 7) of the first embodiment and the second embodiment (see FIG. 8) may be combined. That is, prior to determination as to the external power feeding and the small-power AC charging, ECU 50 may determine whether vehicle 1 is in the preconditioning mode, and set the upper limit duty based on the result of determination, and may determine whether to perform the upper limit guard based on whether the other background noise condition is satisfied.

Although the embodiments of the present disclosure have been described, it should be understood that the embodiments disclosed herein are illustrative and non-restrictive in every respect. The scope of the present disclosure is defined by the terms of the claims, and is intended to include any modifications within the scope and meaning equivalent to the terms of the claims.

What is claimed is:

1. A vehicle comprising:

a battery;

a thermal management system that performs thermal management in the vehicle, the thermal management system including a pump that circulates a heat medium that exchanges heat with the battery; and a controller that controls the thermal management system, wherein when a temperature of the battery is raised using the thermal management system, the controller controls the pump such that a pump noise is suppressed when a prescribed condition indicating that a background noise is small is satisfied as compared with when the prescribed condition is not satisfied, the pump noise being a noise caused by driving of the pump, the background noise being a noise caused by a device other than the pump.

2. The vehicle according to claim 1, wherein the pump is an electric pump in which a flow rate of the heat medium is determined in accordance with a drive frequency, and the controller sets the drive frequency regardless of a resonance band of the electric pump when the prescribed condition is not satisfied, and sets the drive frequency to be outside the resonance band when the prescribed condition is satisfied.

3. The vehicle according to claim 2, wherein the controller controls the drive frequency by outputting a pulse width modulation (PWM) signal to the electric pump, and when the prescribed condition is satisfied, the controller sets a duty of the PWM signal such that the drive frequency becomes lower than a lower limit of the resonance band.

4. The vehicle according to claim 1, wherein the vehicle is configured to perform external power feeding from the battery to an external device of the vehicle, and when the external power feeding is performed, the controller controls the pump such that the pump noise is suppressed as compared with when the external power feeding is not performed.

5. The vehicle according to claim 1, wherein the vehicle is configured to charge the battery from a charging facility external to the vehicle, and when a charging power to the vehicle is smaller than a reference power, the controller controls the pump such that the pump noise is suppressed as compared with when the charging power is larger than the reference power.

6. The vehicle according to claim 1, wherein when a user operation for requesting quick heating of the battery is performed, the controller controls the pump such that suppression of the pump noise is not performed.

7. The vehicle according to claim 1, wherein when a traveling speed of the vehicle is lower than a specified speed, the controller controls the pump such that the pump noise is suppressed as compared with when the traveling speed is higher than the specified speed.

8. The vehicle according to claim 1, wherein the thermal management system further includes a compressor of an air conditioner, and when the compressor is not in operation, the controller controls the pump such that the pump noise is suppressed as compared with when the compressor is in operation.

9. The vehicle according to claim 1, wherein the thermal management system further includes a blower of a radiator, and when the blower is not in operation, the controller controls the pump such that the pump noise is suppressed as compared with when the blower is in operation.

10. A controller of a vehicle having a thermal management system mounted thereon, the thermal management system including a pump that circulates a heat medium that exchanges heat with a battery, the controller comprising a processor, wherein when a temperature of the battery is raised using the thermal management system, the processor suppresses a pump noise when a prescribed condition indicating that a background noise is small is satisfied as compared with when the prescribed condition is not satisfied, the pump noise being a noise caused by driving of the pump, the background noise being a noise caused by a device other than the pump.

11. A control method for a vehicle having a thermal management system mounted thereon, the thermal management system including a pump that circulates a heat medium that exchanges heat with a battery, the control method comprising raising a temperature of the battery using the thermal management system, wherein the raising includes suppressing a pump noise when a prescribed condition indicating that a background noise is small is satisfied as compared with when the prescribed condition is not satisfied, the pump noise being a noise caused by driving of the pump, the background noise being a noise caused by a device other than the pump.

* * * * *